(12) United States Patent
Yu et al.

(10) Patent No.: US 7,960,290 B2
(45) Date of Patent: Jun. 14, 2011

(54) METHOD OF FABRICATING A SEMICONDUCTOR DEVICE

(75) Inventors: Chen-Hua Yu, Hsin-Chu (TW);
Wen-Chih Chiou, Miaoli (TW);
Weng-Jin Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 147 days.

(21) Appl. No.: 11/799,637

(22) Filed: May 2, 2007

(65) Prior Publication Data

US 2008/0272498 A1    Nov. 6, 2008

(51) Int. Cl.
*H01L 23/522* (2006.01)

(52) U.S. Cl. ........ 438/758; 438/700; 438/759; 438/778; 438/780; 438/421; 438/422; 257/506; 257/E21.011; 257/E21.585; 257/E21.597

(58) Field of Classification Search ................ 257/410, 257/276, 288, 522, 506, E21.532, E21.536, 257/E21.561, E21.54, E21.573, E21.581, 257/E21.575, E21.597, E21.584, E21.585, 257/621, 622, 499.501, 502, 508, 510, 513; 438/318, 319, 404, 411, 421–422, 667, 427, 438/437, 618–619

See application file for complete search history.

(56) References Cited

U.S. PATENT DOCUMENTS

| | | | | |
|---|---|---|---|---|
| 5,098,856 A * | 3/1992 | Beyer et al. | .................... | 438/422 |
| 5,753,529 A * | 5/1998 | Chang et al. | .................. | 438/118 |
| 6,057,202 A * | 5/2000 | Chen et al. | .................... | 438/381 |
| 6,383,837 B1 * | 5/2002 | Tsunashima | ................... | 438/106 |
| 6,406,975 B1 * | 6/2002 | Lim et al. | ...................... | 438/421 |
| 6,440,846 B1 * | 8/2002 | Ikeya | ........................ | 438/639 |
| 6,635,389 B1 * | 10/2003 | Lercel | ............................. | 430/5 |
| 7,332,406 B2 * | 2/2008 | Park et al. | ..................... | 438/422 |
| 2002/0019112 A1 * | 2/2002 | Farrar | ........................... | 438/424 |
| 2002/0158337 A1 * | 10/2002 | Babich et al. | ................. | 257/758 |
| 2006/0097290 A1 | 5/2006 | Hietanen | | |
| 2006/0281295 A1 * | 12/2006 | Naujok et al. | ................ | 438/618 |
| 2007/0045780 A1 * | 3/2007 | Akram et al. | ................. | 257/621 |
| 2008/0280435 A1 * | 11/2008 | Klootwijk et al. | ........... | 438/667 |

FOREIGN PATENT DOCUMENTS

| | | |
|---|---|---|
| CN | 1672266 A | 9/2005 |
| CN | 1837027 A | 9/2006 |

OTHER PUBLICATIONS

Chinese Patent Office, Office Action mailed Mar. 18, 2010; Application No. 200710149603.8, 7 pages.

\* cited by examiner

*Primary Examiner* — A. Sefer
*Assistant Examiner* — Ermias Woldegeorgis
(74) *Attorney, Agent, or Firm* — Haynes and Boone, LLP

(57) ABSTRACT

A method for fabricating a semiconductor device. A preferred embodiment comprises forming a via in a semiconductor substrate, filling the via with a disposable material such as amorphous carbon, forming a dielectric layer on the substrate covering the via, performing a back side etch to expose the disposable material in the via. A back side dielectric layer is then depositing, covering the exposed via. A small opening is then formed, and the disposable material is removed, for example by an isotropic etch process. The via may now be filled with a metal and used as a conductor or a dielectric material. The via may also be left unfilled to be used as an air gap.

16 Claims, 18 Drawing Sheets

METHOD OF FABRICATING A SEMICONDUCTOR DEVICE

TECHNICAL FIELD

The present invention relates generally to semiconductor devices and their fabrication, and more particularly relates to a method for fabricating vias and similar structures in semiconductor devices, the method being particularly suited to producing vias that are very narrow and have high aspect ratios.

BACKGROUND

Generally, a semiconductor device is an electronic component or structure, or a collection of such elements, which are fabricated onto a semiconductor wafer and used to carry or manipulate electrical signals. A semiconductor wafer is a thin piece of semiconductor material, such as silicon, onto which will be fabricated a large number of these electronic components. The components are interconnected to form integrated circuits. For efficiency, each wafer is typically used to form a number of dice, each of which may include millions of components. When fabrication is complete, the dice are separated and each individual die is packaged for installation into an electrical appliance such as a mobile telephone, personal computer, or MP3 player.

The fabrication of the electrical components on a wafer involves a series of process steps, most or all of which are now automated. In general, these steps include ion implantation to impart semiconductor properties to, for example, the silicon wafer, and the selective formation and removal of alternating layers of insulating and conducting material. As the individual components or structures are very small, specialized processes have been developed in order to properly form them. Although extremely small features are currently being fabricated, the popularity of compact and energy-efficient electrical appliances is compelling manufacturers to produce ever smaller and, at the same time, more capable components. New fabrication techniques are constantly needed.

A wafer surface provided for forming electronic components is sometimes referred to as a substrate. There are several types of semiconductor structures that may be formed on a semiconductor substrate. FIG. 1 is a side (elevation) view illustrating in cross section a typical semiconductor device 10. Note that as used herein, the term "device" is intended as a general term used to refer to a particular functioning component, part of a component, or collection of components. In other words, the particular device being discussed is defined by the feature or features recited, and by the context. A "semiconductor device" is one being used in a semiconductor application, and no specific properties relating to a particular component or components is implied by use of the term itself.

In the semiconductor device 10 of FIG. 1, a first transistor 11 and second transistor 16 have been formed at the surface 21 of substrate 22. In addition to a gate structure 12, first transistor 11 includes a source region 14 and a drain region 15 defining a channel 13. Likewise transistor 16 includes a gate structure 17, and a source region 18 and a drain region 20 defining a channel 19. Under certain conditions, such as the application of a charge to the respective gate structures 12 and 17, electrical current may flow through the channels 13 and 19 between the respective source and drain regions defining them. Transistors, therefore, are basically small switches that may be used for the manipulation of electrical signals. In the example of FIG. 1, transistors 12 and 16 are separated by an isolation structure 25, which has been formed in a trench 24 and is intended to prevent the operation of one of the transistors from interfering with operation of the other. This type of isolation structure is sometimes referred to as an STI (shallow trench isolation) structure. The formation of an STI may be seen more clearly in reference to FIGS. 2a through 2d.

FIGS. 2a through 2d are a sequence of side views illustrating in cross-section the configuration of a semiconductor device 30 at various selected stages of fabrication. In FIG. 2a, it may be seen that a buffer oxide layer 34 has been formed over, and in this case directly over the substrate. The substrate may, for example, be silicon, and the oxide layer a silicon dioxide material. A photoresist layer 36 has been formed directly over the buffer oxide layer 34. Photoresist is a material that may be patterned, that is, formed into a pattern of structures and openings, because it changes composition when exposed to light. To create the pattern, the photoresist layer is selectively exposed through a mask bearing a pattern. The exposed portions either remain or are washed away (depending on the type of photoresist used) by a solvent suitable for this purpose. The remaining structures are typically used to protect the areas underneath them, allowing unprotected area to be etched themselves. When they are no longer needed, the remaining photoresist structures are removed using a solvent selected for that purpose. This process is often referred to as photolithography.

In this example, the isolation structure is formed by first forming photoresist structures 43 and 44, then etching a recess 38 into the substrate 32, and in the oxide layer 34 disposed above it. This configuration is illustrated in FIG. 2b. Once the recess 38 has been formed, an oxide material 40 is deposited, in this case filling trench 38 and covering the surrounding portions of semiconductor device 30. This configuration is shown in FIG. 2c. The portion of oxide layer 40 that is disposed within the substrate 32 portion of recess 38 is now referred to as isolation structure 39. To finish the fabrication process, the remainder of oxide layer 40 is removed, for example by a CMP (chemical metal polishing) process. The photoresist structures 43 and 44 are removed as well. The resulting configuration of semiconductor device 30, now including isolation device 39, is depicted in FIG. 2d.

Many similar structures may be formed in this manner. For example, a structure more commonly referred to as a via is shown in FIG. 3. FIG. 3 is a side view illustrating in cross section a typical filled via structure 50. As with the recess 38 referred to above, via 50 is formed in a substrate 55 by etching a recess 54 and filling it with a fill material 53. Note that fill material 53 may be a dielectric material such as silicon dioxide or may be a low-k dielectric. It may be, and often is, a conductive material such as copper. In the example of FIG. 3, the via recess 54 is filled with a conductive fill material 53 to provide a conductor from the front side surface 51 of substrate 55 to the backside 52.

As can be seen in FIG. 3, a portion 56 of the fill material 53 in face protrudes slightly from the back side 52 so that contact may be made with a pad or other target contact area (not shown), such as one on another chip. To form this structure, the via recess 54 may have been formed, filled, and then the back side 52 etched to expose the protruding portion 56 of the fill material 53. Note that in applications like the one shown in FIG. 3, the via must often be relatively long compared to, for example, the STI 25 shown in FIG. 1, simply because it must extend from one side of the substrate to the other. The via usually cannot be as wide, either, because many such structures may be needed in a relatively limited area. The relationship if depth (length) to width is called the aspect ratio. Referring to FIG. 3, the length of the via is called out as $L_v$, while the width is $W_v$. An aspect ratio $L_v/W_v$ of about five or greater is sometimes referred to as a high aspect ratio (A/R) via.

Unfortunately, existing methods often use materials and processes that result in unsatisfactory results. If the vias, and especially those with a high aspect ratio, cannot be properly created and filled, then their size may need to be increased to ensure proper fabrication. As mentioned above, however, what are currently in demand are small devices with a higher via density so that more components may be included in a semiconductor chip.

Needed, therefore, is a way to fabricate semiconductor devices that include vias, and especially those with high aspect ratios, which produces more reliable devices and enables higher via density while not adding inordinately to the cost of fabrication or necessitating undue and difficult process modification. The present invention provides just such as solution.

SUMMARY OF THE INVENTION

These and other problems are generally solved or circumvented, and technical advantages are generally achieved, by preferred embodiments of the present invention which provides a reliable method of forming semiconductor devices having one or more vias, and in particular those having vias or recesses filled with a gas, a conductor, or a dielectric that exhibit a high aspect ratio.

In accordance with a preferred embodiment of the present invention, a method for fabricating a semiconductor device includes providing a substrate, forming a via in the substrate, filling the via with a disposable fill material, forming a first dielectric layer portion over the filled via, exposing a portion of the disposable material, and removing the exposed material. The via may then be filled with a conductive material or closed and left filled with only air.

In accordance with another preferred embodiment of the present invention, a method of forming a gap in a semiconductor device includes forming at least one via in a semiconductor substrate, filling the via with a disposable material, depositing a dielectric layer over the disposable material, forming a small opening in the disposable material, removing the disposable material, and forming a second dielectric layer over the small opening.

In accordance with another preferred embodiment of the present invention, a method for filling a via formed in a semiconductor substrate includes depositing a disposable material in the via, forming a dielectric layer over a first end of the via and the adjacent substrate surface, thinning the substrate to expose a second via end, removing the disposable material through the open second via end, depositing a via fill material in the via through the open second via end, and forming a second dielectric layer over the second end of the via and the adjacent substrate.

An advantage of a preferred embodiment of the present invention is that vias filled with metal or a dielectric material are more easily and reliably produced, especially in applications using vias with a high aspect ratio. Higher device density results. At the same time the methods of the present invention are compatible with or easily integrated into existing semiconductor fabrication processes.

A further advantage of a preferred embodiment of the present invention is that when used in the production of air gaps for semiconductor device metal layers, the resulting series of interconnects may experience a lower level of RC delay.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
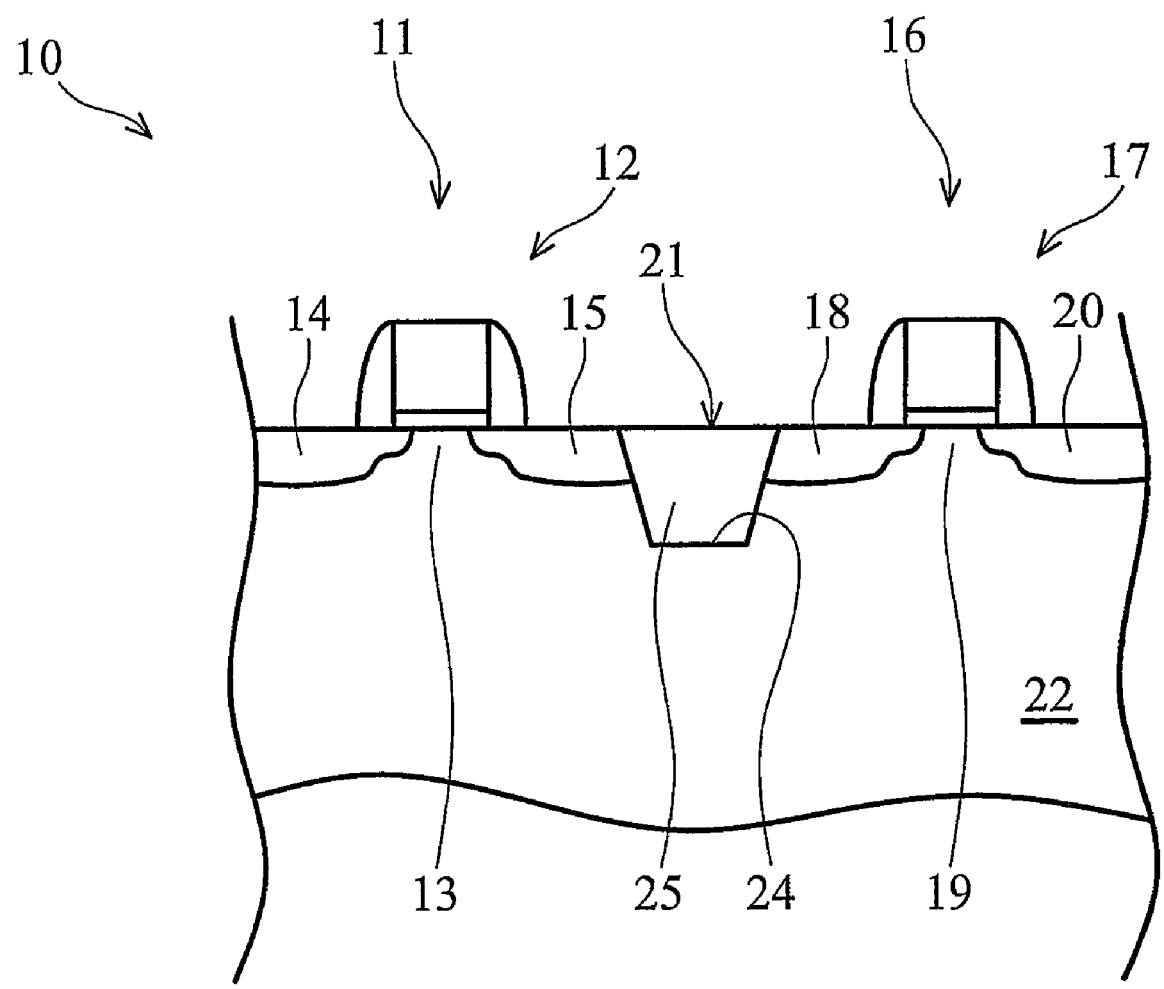
FIG. 1 is a side (elevation) view illustrating in cross section a typical semiconductor device.
Figure 2A:
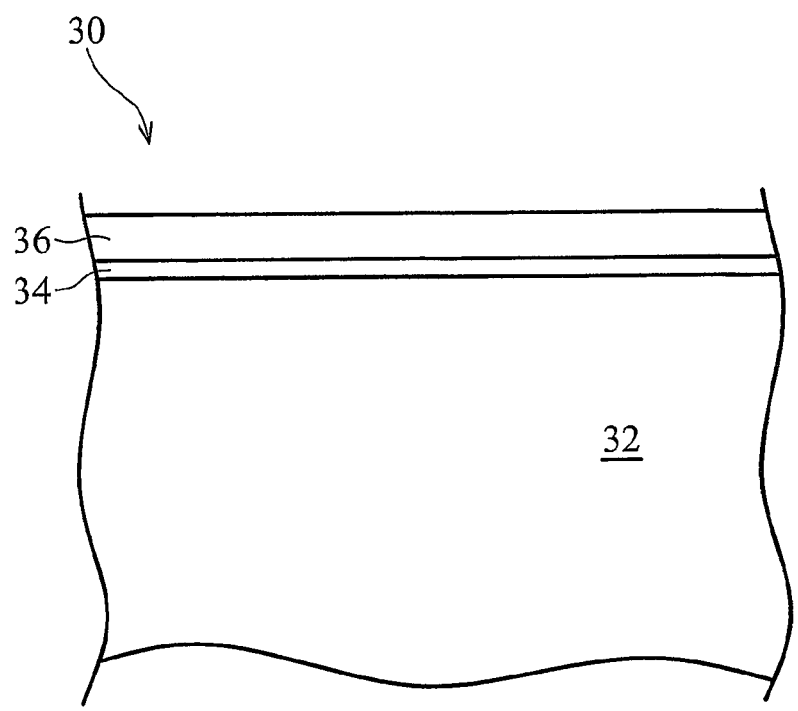
FIGS. 2a through 2d are a sequence of side views illustrating in cross-section the configuration of a semiconductor device at various selected stages of fabrication.
Figure 2B:
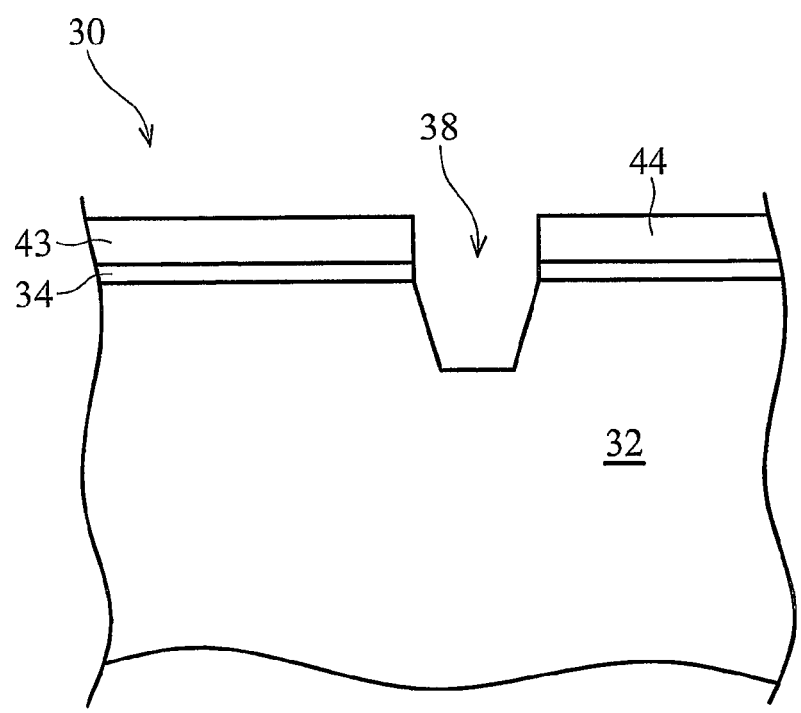
Figure 2C:
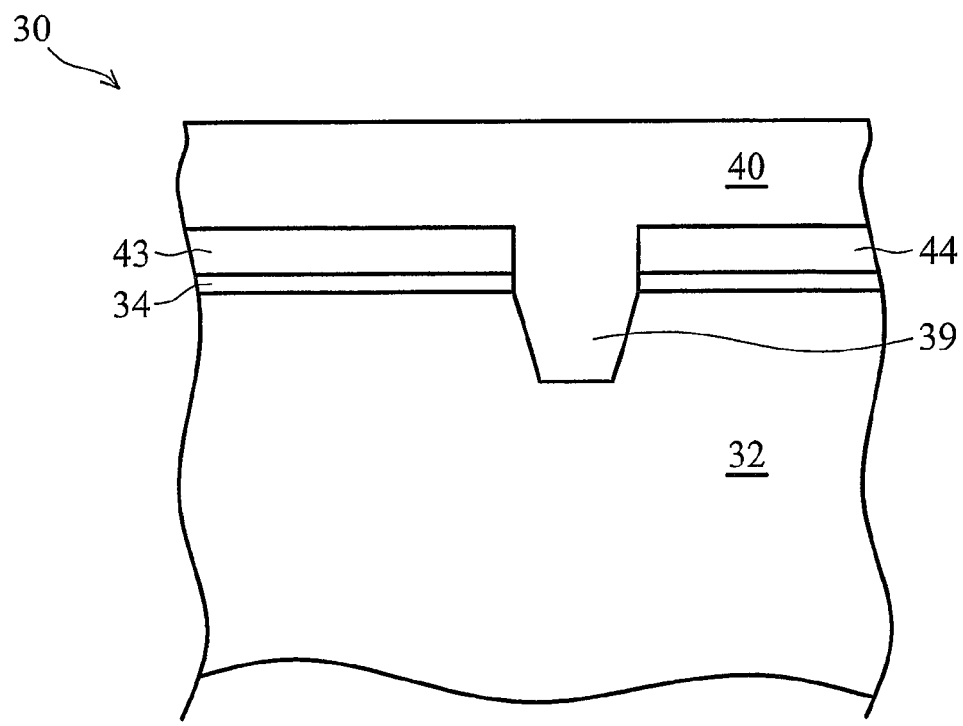
Figure 2D:
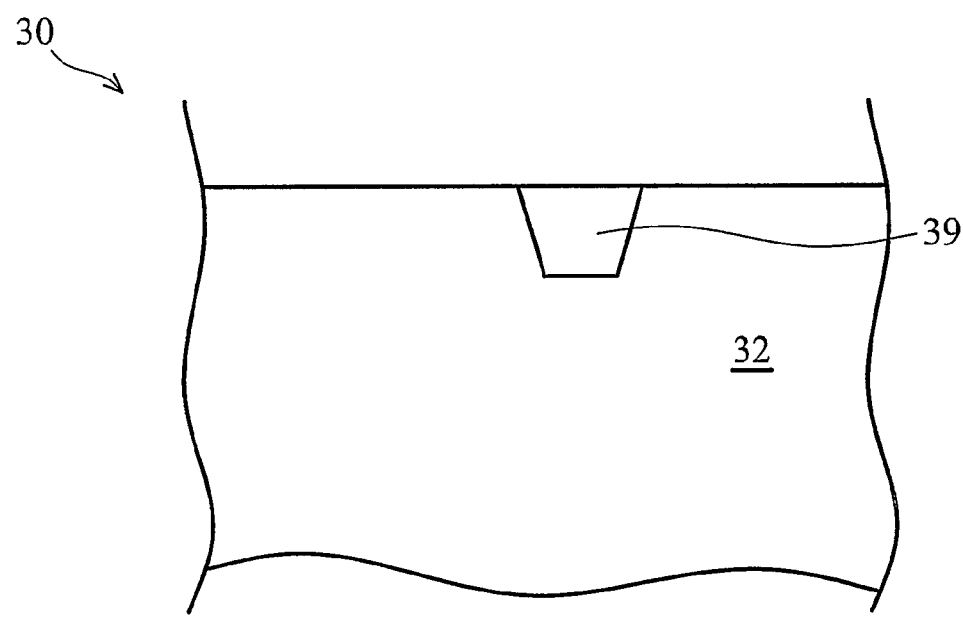
Figure 3:
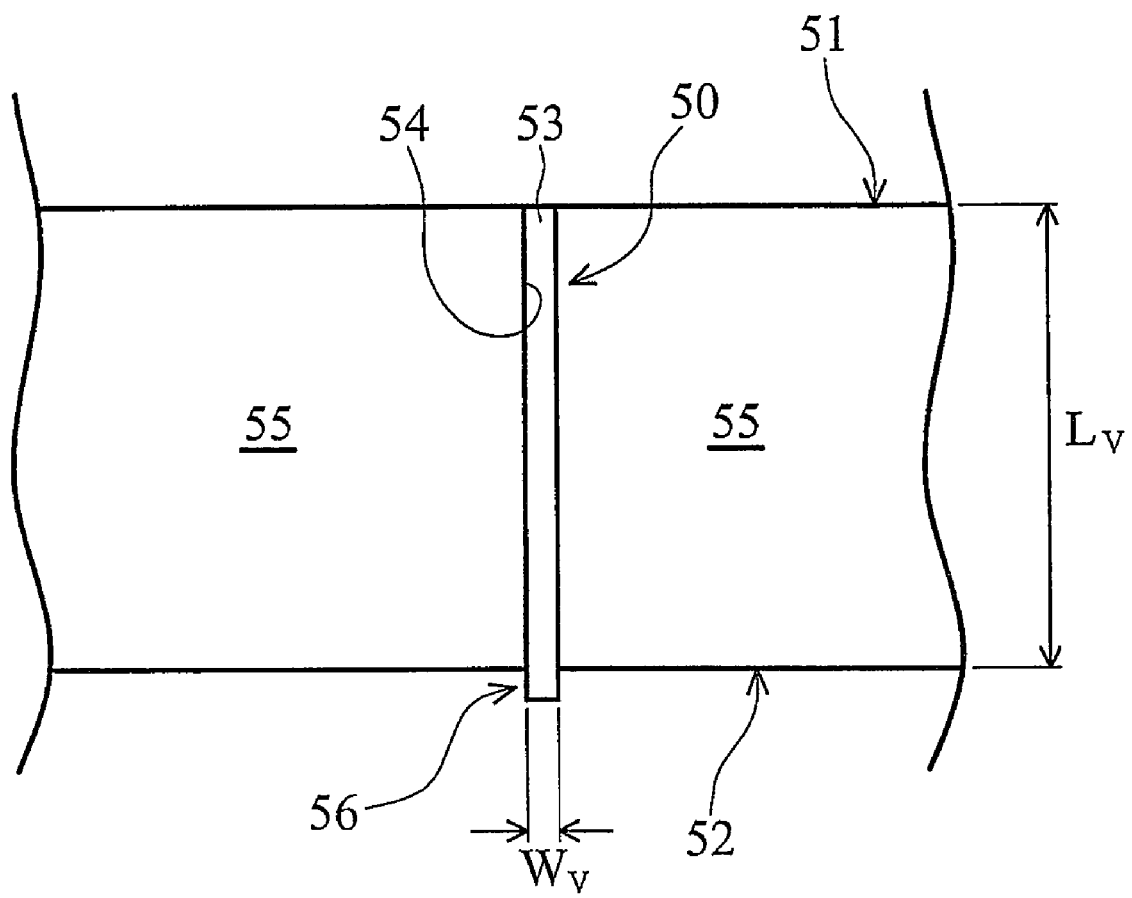
FIG. 3 is a side view illustrating in cross section a typical filled via structure.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to number preferred embodiments recited in a specific context. The invention may also be applied, however, to other embodiments as well. For example, the operations described below may often be performed in a somewhat modified order. The methods of the present invention may be performed in any logically-consistent order unless a specific order is explicitly required or apparent from the context. In some cases the operations described below may be optional in some or all embodiments, and again, are not required unless recited or apparent in context. Finally, the performance of operations in addition to those recited is considered within the spirit of the invention unless an exclusive method is explicitly claimed. Several embodiments of the present invention will now be described. Different materials may, of course, be used if known or discovered to be suitable for a given operation of one or more of the methods.

FIGS. 4a through 4f are a sequence of side views illustrating in cross-section section the configuration of a semiconductor device 100 at various selected stages of fabrication according to an embodiment of the present invention. In this embodiment, a substrate 101 is provided and a photoresist layer 105 is formed on the substrate front side 102 and patterned. The substrate is, for example, a wafer of silicon, silicon germanium, or some other suitable material. Again, the terms substrate and semiconductor substrate are considered equivalent for the purposes of describing the invention, regardless of when or to what extent the substrate is doped or otherwise treated. A via recess 103 is then etched, resulting in the configuration shown in FIG. 4*a*. Note that while only a portion of substrate 101 and a single recess is shown, in most applications there would be a great many via recesses formed simultaneously. The via recess 103 is, in this embodiment, a high aspect ratio (A/R) via, though this is not a requirement of the invention unless explicitly recited. (Note that the Figures are not necessarily drawn to scale.) After the via has been etched, the remaining photoresist may be removed. A sidewall passivation layer (not shown) may be formed, either before or after photoresist removal, although this operation is presently considered optional.

Figure 4A:
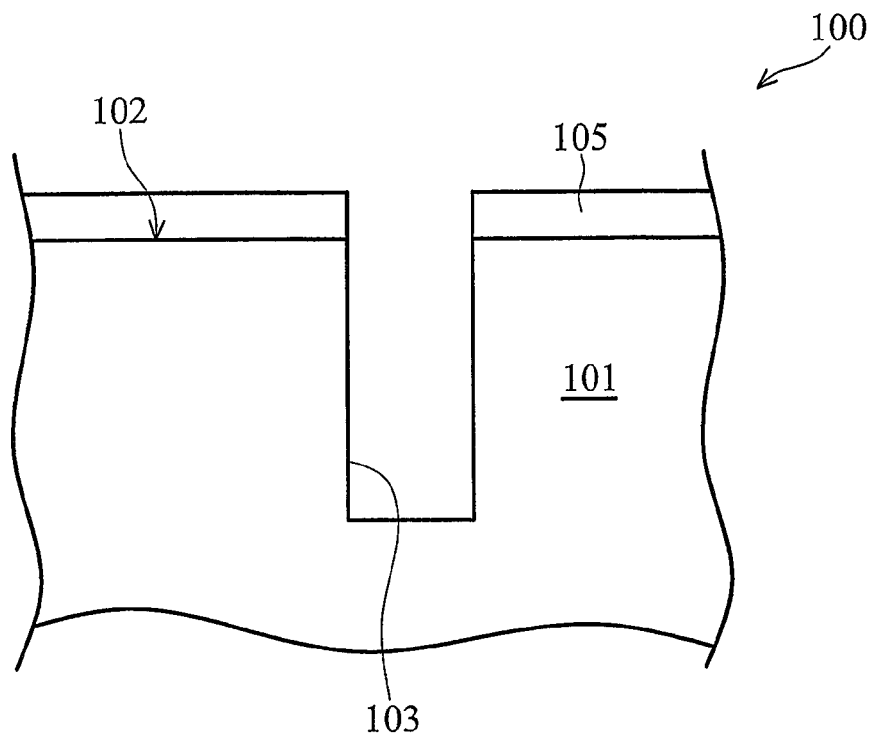
FIGS. 4a through 4f are a sequence of side views illustrating in cross-section the configuration of a semiconductor device at various selected stages of fabrication according to an embodiment of the present invention.
Figure 4B:
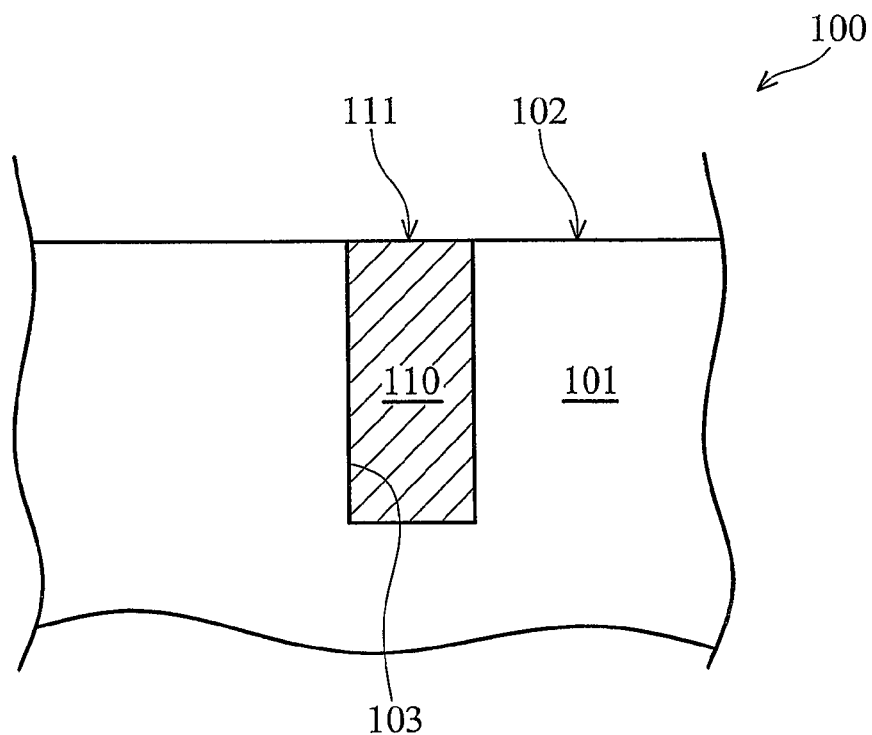

In accordance with this embodiment, the via recess 103 is then filled with a disposable material such as amorphous carbon, although other similar materials may be used as well. Other suitable disposable materials include, for example, oxides and low-k materials, silicon nitride (SiN), and polysilicon. This is typically accomplished by depositing a layer 110 of the disposable material, then planarizing the layer 110 until any excess portions (not shown) have been removed. That is, until the disposable fill material 110 fills via recess 103, but does not cover any portion of the front side 102 of substrate 101. In other words, the upper boundary 111 of the fill material 110 is co-planar with the front surface 102 of substrate 101, a relationship that is presently preferred by not in all applications required. This configuration is shown in FIG. 4*b*.

Figure 4C:
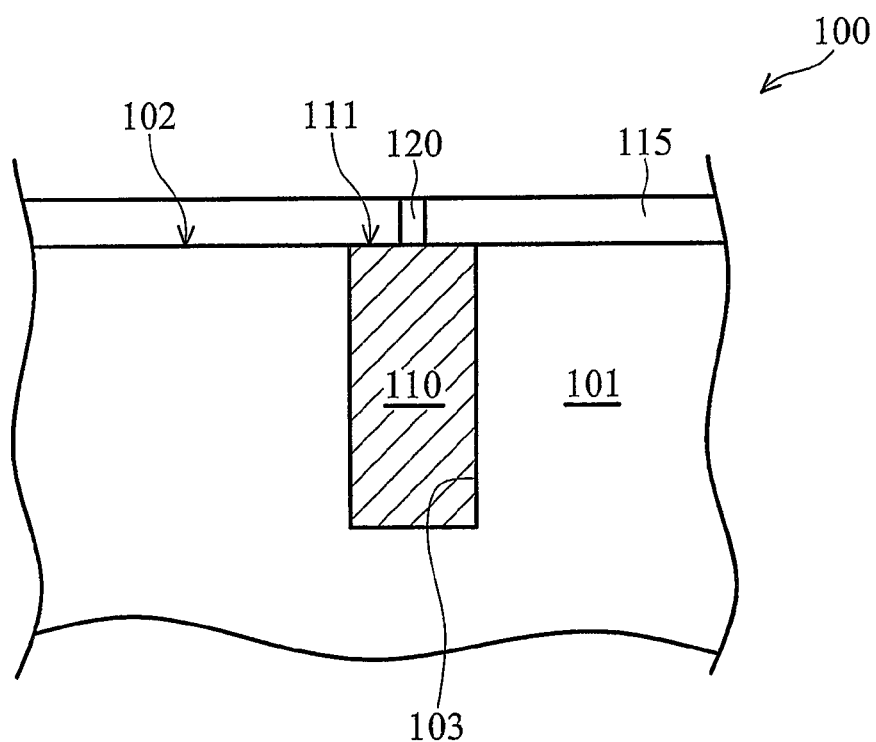

A dielectric layer 115 is then formed over the front side 102 of substrate 101, the dielectric layer 115 being disposed over the upper boundary 111 of disposable fill material 110 as well. In this embodiment, via recess 103 is to be filled with a conductive material, so an interconnect via 120 is formed in the dielectric layer 115. The interconnect via may be formed, for example, by etching a via recess and then filling it with a conductor fill material, for example copper. For simplicity, however, these separate steps and components are referred to only generally here. Semiconductor device 100 and the dielectric layer 115 in which interconnect via 120 is embedded, are shown in FIG. 4*c*.

Figure 4D:
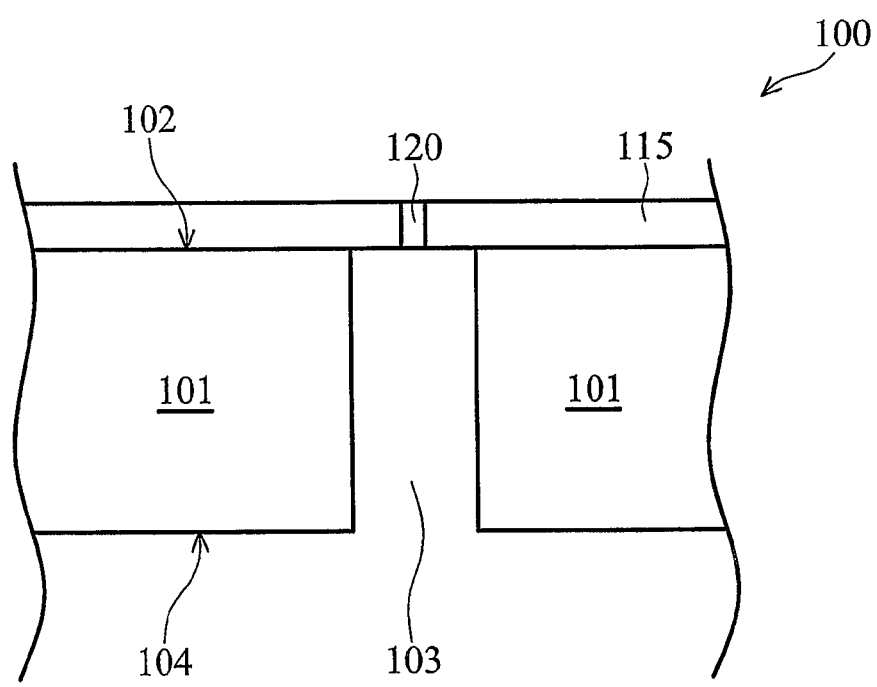
Figure 4E:
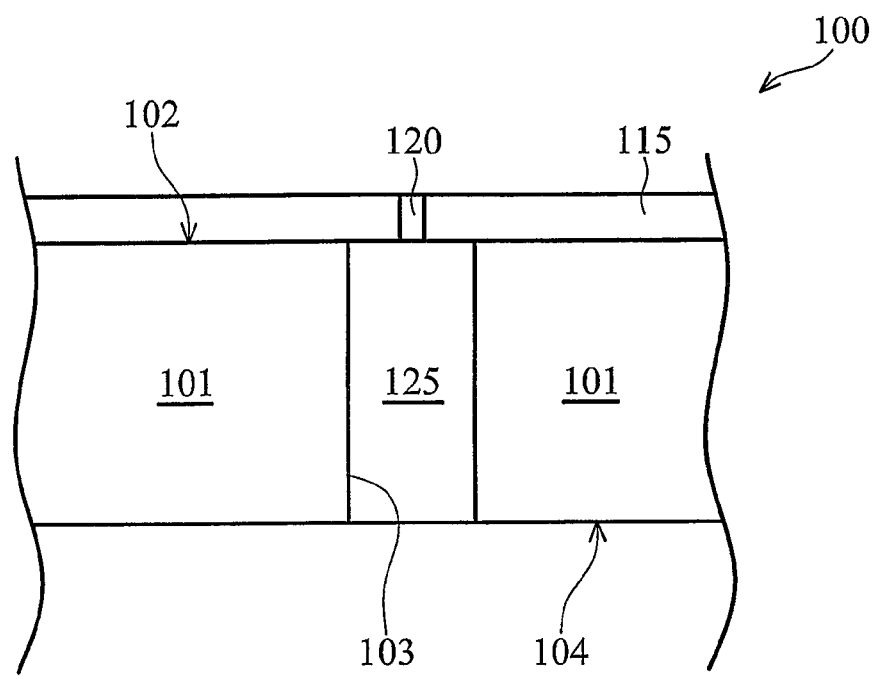

In the embodiment of FIGS. 4*a* through 4*f*, the back side 104 of substrate 101 has been reduced, that is, brought closer to front side 102, for example by etching or polishing. Not only does this have the effect of thinning the wafer substrate 101, but it exposes the disposable fill material 110 by opening the lower end of via recess 103. Note the depth of via recess 103 may be reduced in this process as well, though any such reduction is expected to be small relative to the total depth and is disregarded for the purposes of this disclosure. When the fill material 110 has been exposed, it is removed from the via recess 103, for example by an isotropic etch process. The resulting configuration is shown in FIG. 4*d*.

Figure 4F:
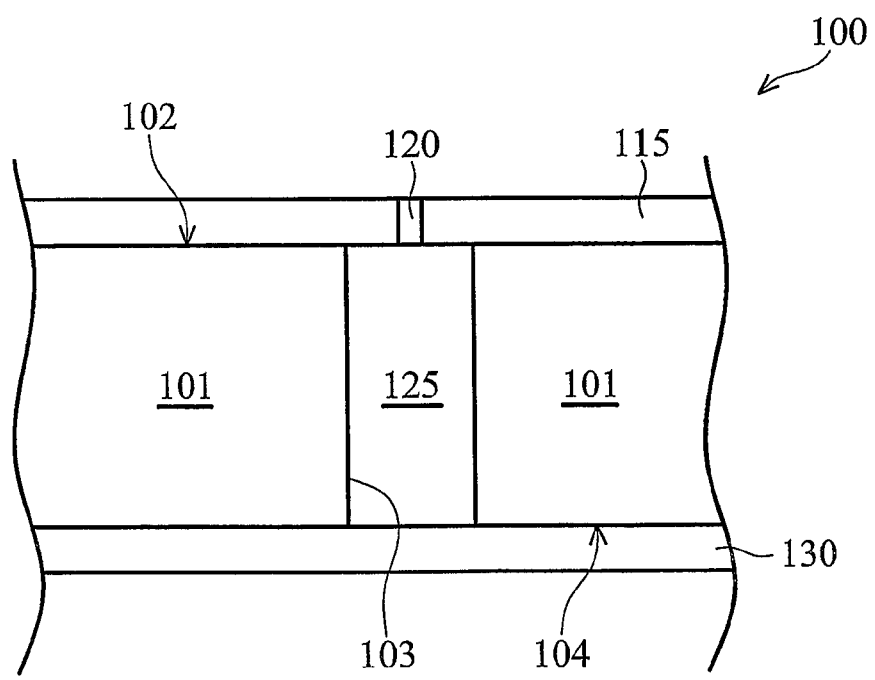

In this embodiment, the via recess 103 is now filled with a conductive material 125 such as copper. This may be done, for example, by depositing a copper layer, then using a CMP (chemical mechanical polishing) process to reduce the extent of the conductive fill material to that shown in FIG. 4*e*. Note that when reference is made herein to filling vias with a conductive material, this does not preclude first forming a passivation layer on the via's sidewall, or forming a barrier layer between the sidewall and the conductive fill material, or both. In other embodiments (not shown) another type of fill material may be used, such as a dielectric. Returning to the embodiment of FIGS. 4*a* though 4*f*, once the conductive fill material 125 is properly formed, a backside dielectric layer 130 is formed, covering the back side 104 of substrate 101 and the lower boundary of the conductive fill material 125. This configuration is shown in FIG. 4*f*.

Figure 5A:
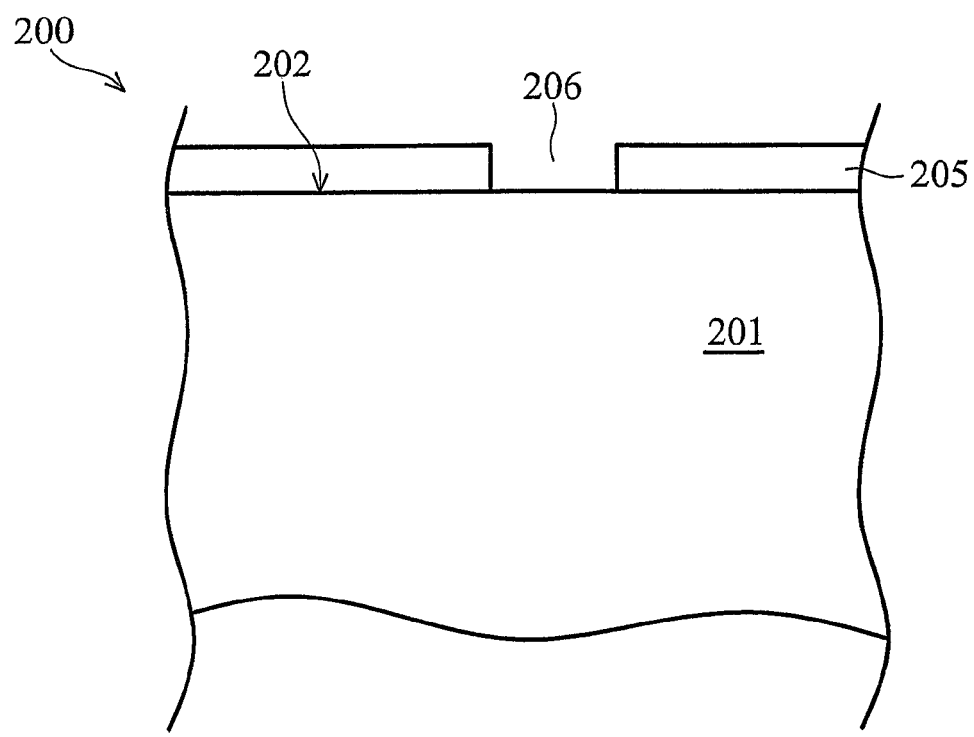
FIGS. 5a through 5i are a sequence of side views illustrating in cross-section the configuration of a semiconductor device at various selected stages of fabrication according to another embodiment of the present invention.
Figure 5B:
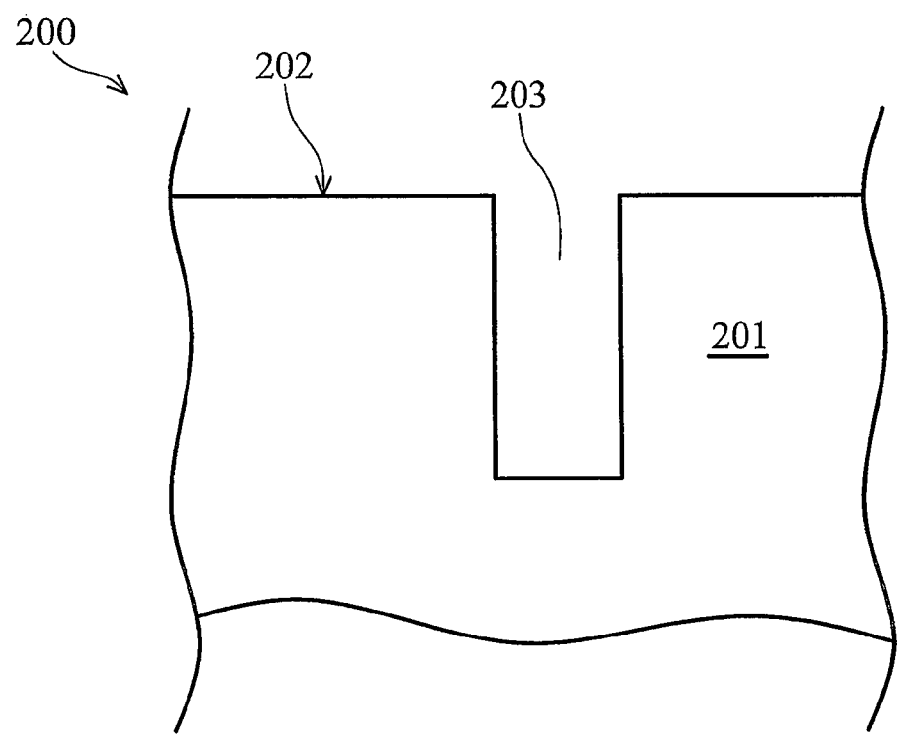

FIGS. 5*a* through 5*i* are a sequence of side views illustrating in cross-section section the configuration of a semiconductor device 200 at various selected stages of fabrication according to another embodiment of the present invention. Note that while this embodiment is different in some respects from the embodiment described above, it is also in some respects similar and where possible, similar, though not necessarily identical features have been numbered analogously. In this embodiment, as shown in FIG. 5*a*, the front side surface 202 of substrate 201 has been covered with a photoresist layer 205, which has been patterned to form a recess 206. Recess 206 exposes a portion of substrate front side 202 so that a via recess 203 may be formed, generally by etching. When the via recess 203 has been formed, the remaining portions of photoresist layer 205 may be removed, as shown in FIG. 5*b*.

Figure 5C:
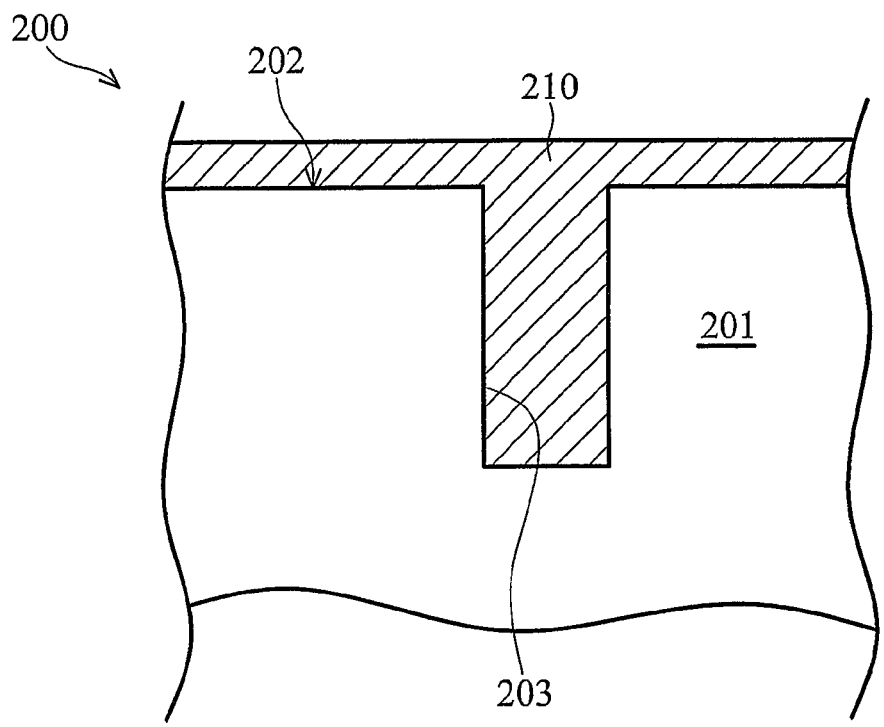
Figure 5D:
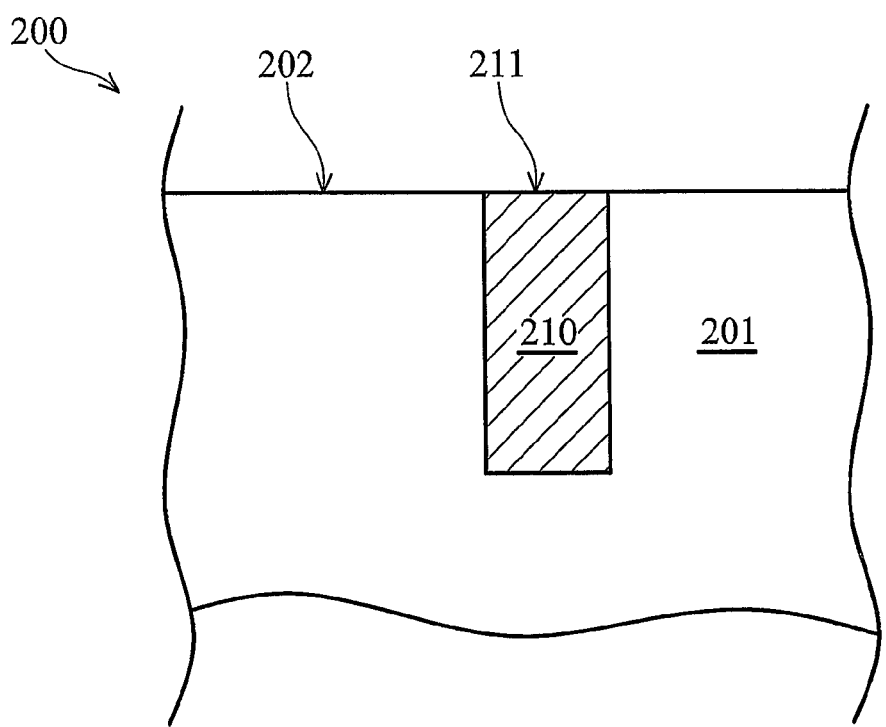
Figure 5E:
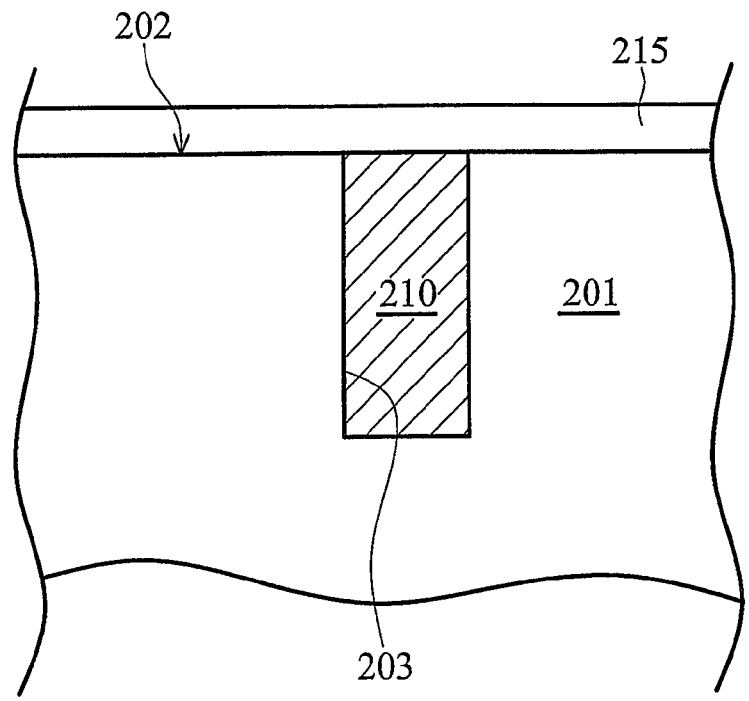
Figure 5F:
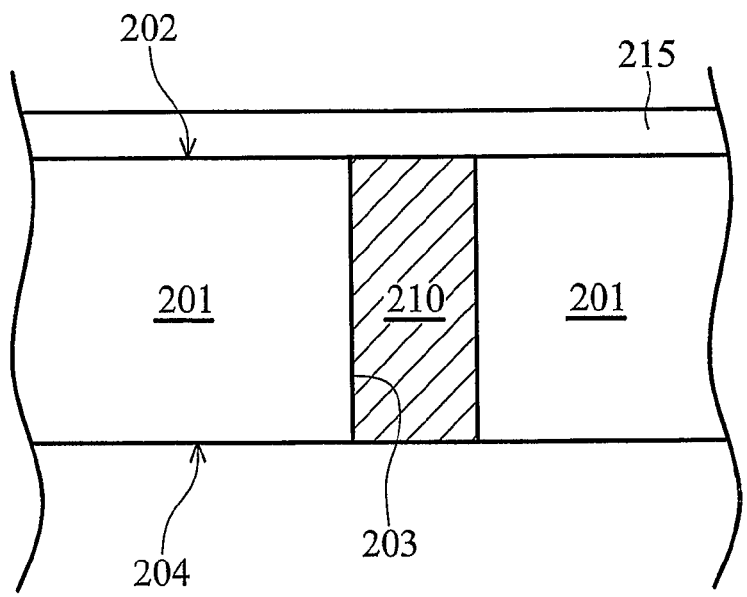
Figure 5G:
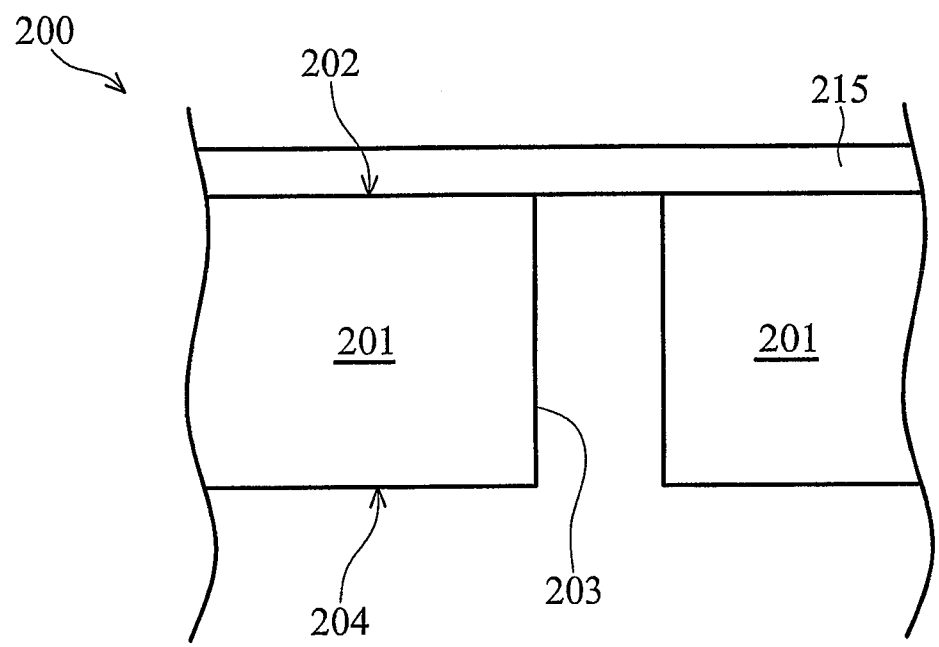

In this embodiment, a layer of disposable fill material 210 is then formed on the front side 202 of substrate 201, filling the via recess 203. This configuration is shown in FIG. 5*c*. A planarization operation may then be performed, as mentioned in the embodiment of FIGS. 4*a* through 4*f*, described above, so that the upper boundary 211 of fill material 210 is coplanar with front side surface 202 of substrate 201, as shown in FIG. 5*d*. A dielectric layer 215 is then deposited on front side 202 that also covers the upper boundary 211 of fill material 210. This configuration is shown in FIG. 5*e*. A reducing operation is then performed to reduce the thickness of substrate 201 to the point that the disposable fill material 210 has been exposed, as shown in FIG. 5*f*. The disposable fill material 210 is then removed, as shown in FIG. 5*g*. In an alternate embodiment (not shown) the disposable fill material is simply removed during the process of reducing backside 204.

Figure 5H:
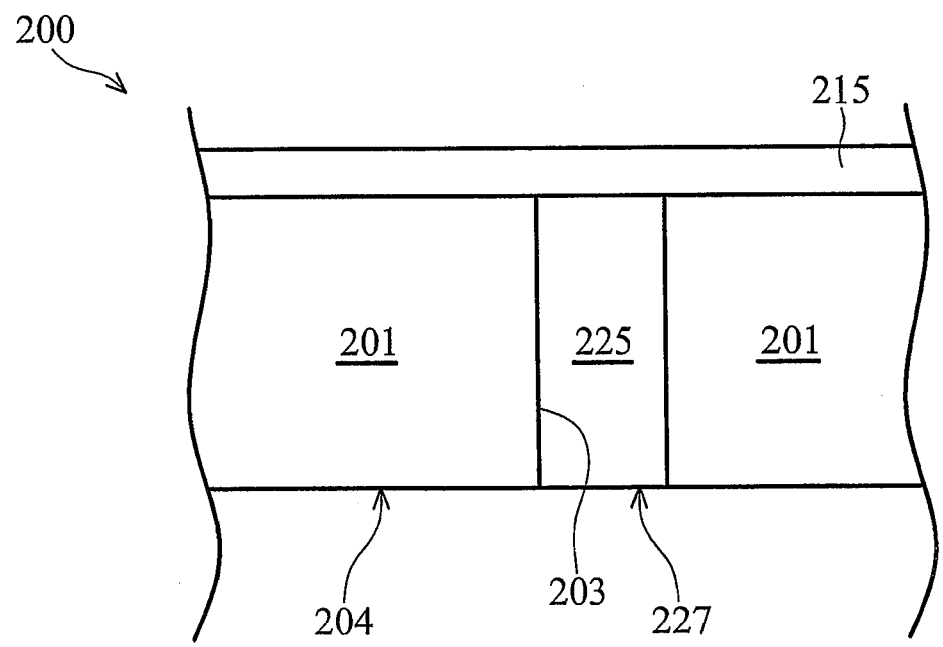
Figure 5I:
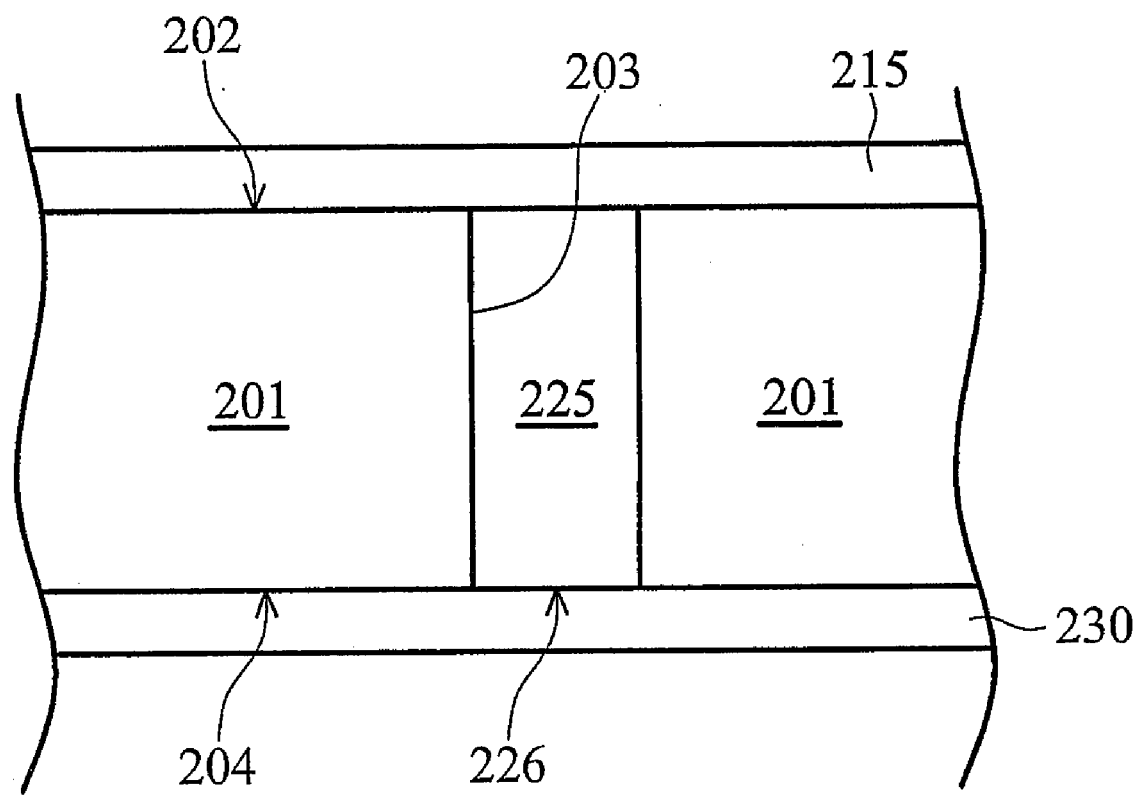

In the embodiment of FIGS. 5*a* through 5*i*, the via recess 203 is then filled with a conductive fill material 225, though again, in other embodiments (not shown) another fill material such as a low-k dielectric may be used as well. FIG. 5*h* illustrates the semiconductor device 200 with conductive fill material 225 disposed within via recess 203. As should be apparent, a planarization step has been performed so that the lower boundary 227 of conductive fill material 225 is coplanar with backside 204 of substrate 201. Finally, a backside dielectric 230 is formed over the backside surface 204 of substrate 201, covering also the lower boundary 227 of conductive fill material 225. This configuration is illustrated in FIG. 5*i*.

Figure 6A:
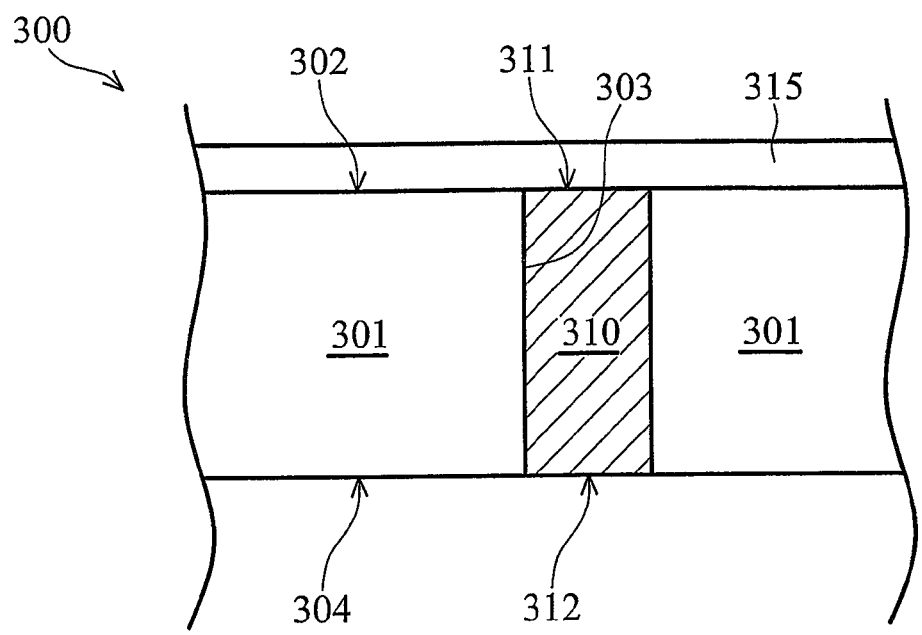
FIGS. 6a through 6e are a sequence of side views illustrating in cross-section the configuration of a semiconductor device at various selected stages of fabrication according to another embodiment of the present invention.
Figure 6B:
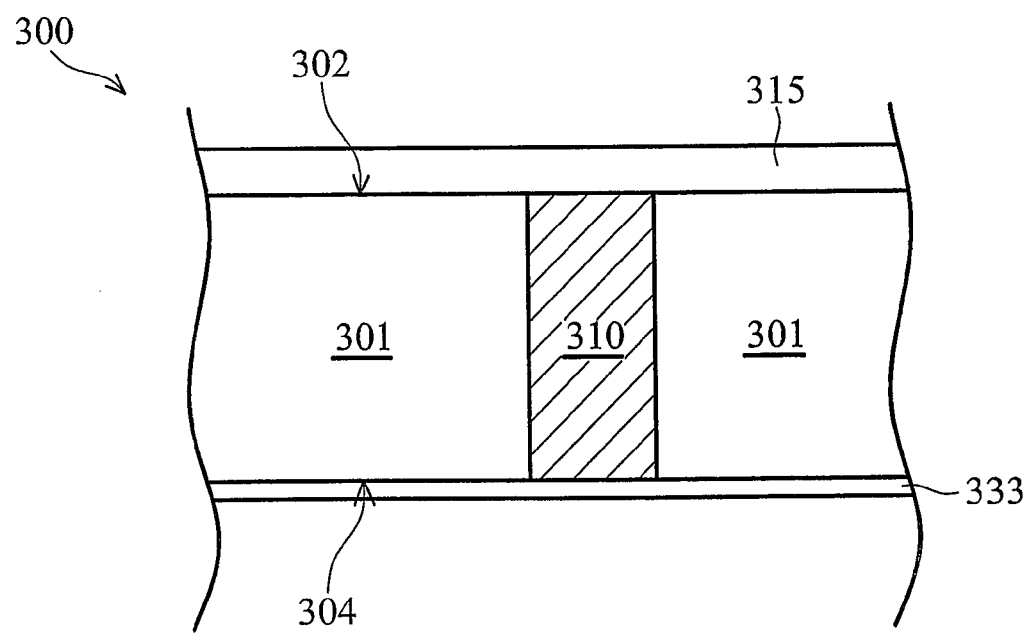

FIGS. 6*a* through 6*e* are a sequence of side views illustrating in cross-section section the configuration of a semiconductor device 300 at various selected stages of fabrication according to another embodiment of the present invention. Here it is noted that many of the initial steps of this embodiment are similar or identical to those described in reference to FIGS. 5*a* though 5*i*, above, and for convenience are not repeated here. Again, similar or identical features are where possible numbered analogously. In FIG. 6*a*, it may be seen that a disposable fill material 310 fills the via recess 303 formed in substrate 301. A dielectric layer 315 has been formed over front side surface 302 of substrate 301, and covers upper boundary 311 of disposable fill material 310. The lower boundary 312 of disposable fill material 310 is exposed, due to the reduction of backside 304 of substrate 301, which is now co-planar with the lower boundary 312. A first backside dielectric layer 333 is then formed, as shown in FIG. 6b, covering backside 304 and lower boundary 312.

Figure 6C:
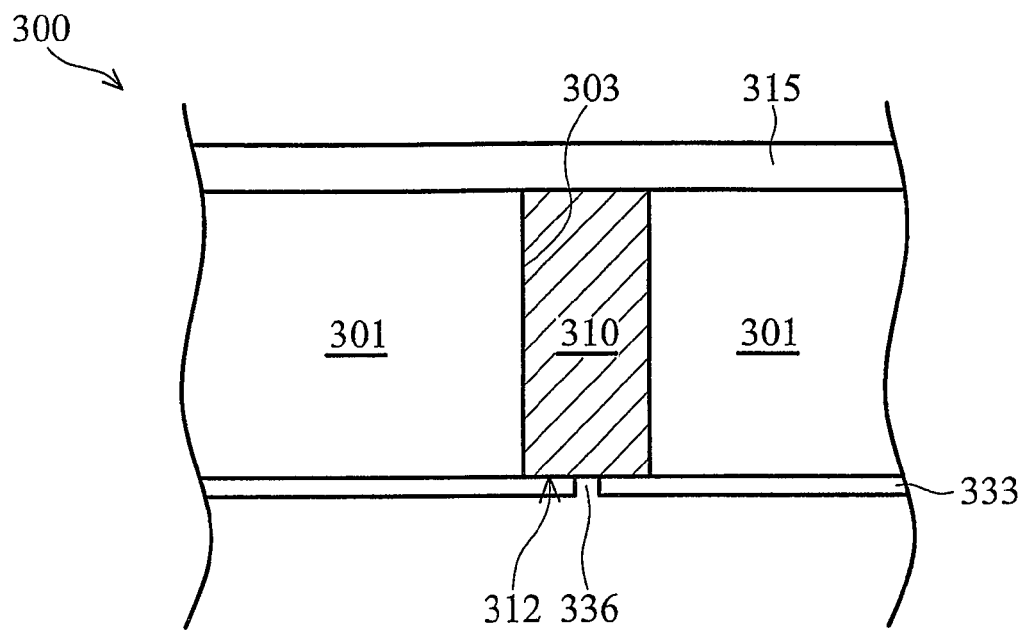
Figure 6D:
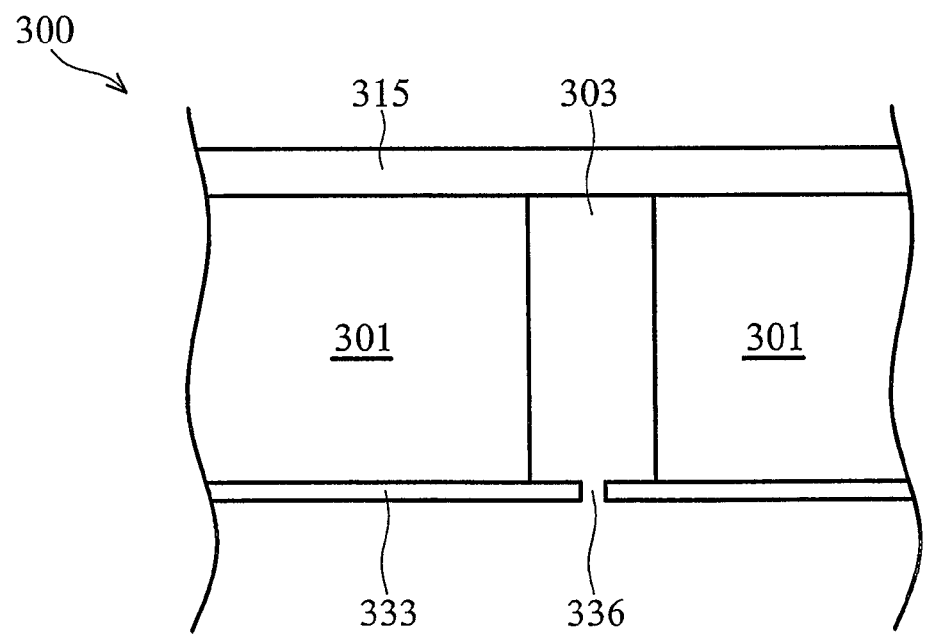

A small opening 336 is then formed in first backside dielectric layer 333, as shown in FIG. 6c. This small opening 336 exposes a portion of the lower boundary of disposable fill material 310. Although shown centered in relation to via recess 303, this is not necessary in all embodiments so long as the disposable fill material 310 is accessible. Using the small opening 336, a selective etching process is then performed until all of the disposable fill material 310 has been removed, as shown in FIG. 6d. Via recess 303 is then empty, or put another way "air-filled". Naturally, the air that via recess 303 is filled with is the ambient air, as altered by the etching process or as replaced later. There is no requirement that any particular gas occupies via recess upon its closure, though in some applications a particular atmosphere may be desired.

Figure 6E:
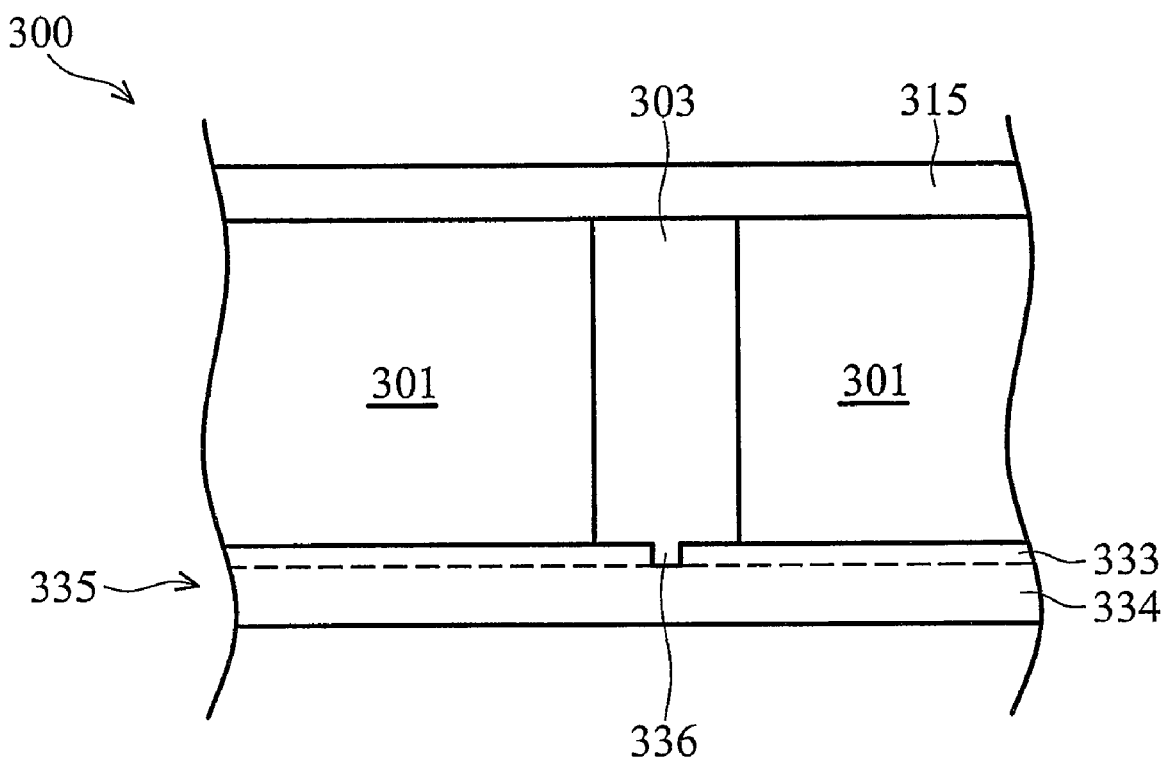

The closing of small opening 336 is, in this embodiment, achieved by forming a second backside dielectric layer 334 on the first backside dielectric layer 333, closing the recess 336 in the process. In this embodiment, the first and second backside dielectric layers 333 and 334 are of the same material and combine to form backside dielectric layer 335, as shown in FIG. 6e (where the former lower boundary of first backside dielectric layer 333 is shown by broken line). In other embodiments the two backside dielectric layers may be of different materials, and in some cases there may be more than two layers. In this light, it is noted that in regard the size of small opening 336, "small" refers to an opening that may be closed in this fashion. Naturally, the small opening 336 must also be large enough for the etching process that removes the disposable fill material 310, described above, as well.

Figure 7A:
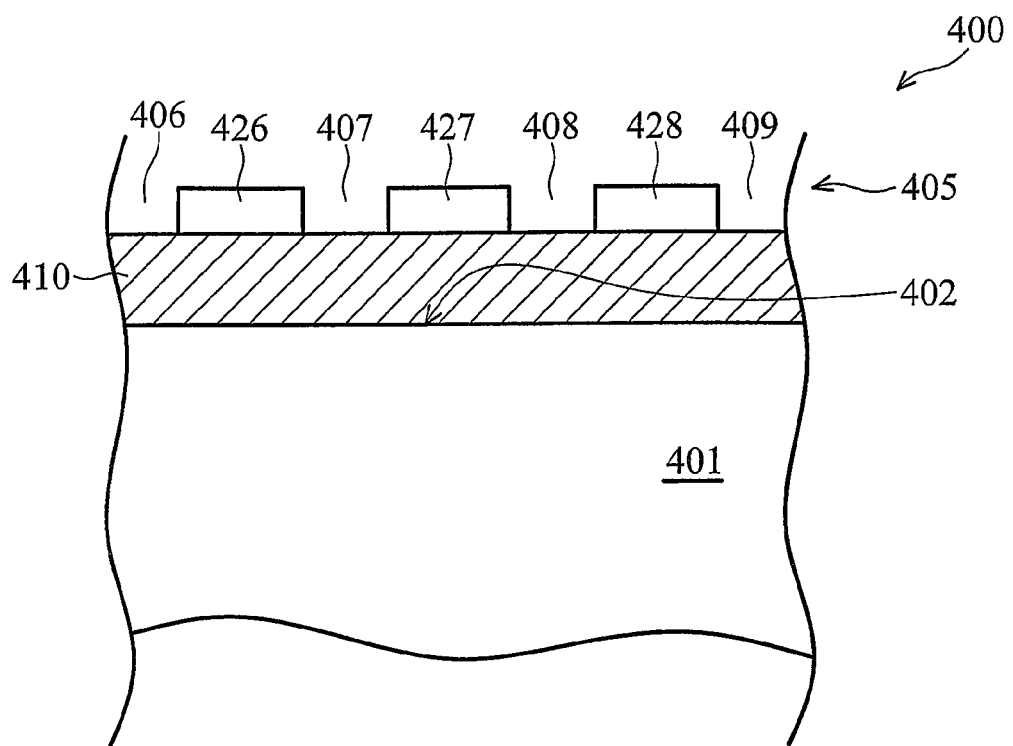
FIGS. 7a through 7e are a sequence of side views illustrating in cross-section the configuration of a semiconductor device at various selected stages of fabrication according to another embodiment of the present invention.

FIGS. 7a through 7e are a sequence of side views illustrating in cross-section section the configuration of a semiconductor device 400 at various selected stages of fabrication according to another embodiment of the present invention. The embodiment of FIGS. 7a through 7e is similar in some respects to those described above, but different in others. Again, where possible similar features are numbered analogously, although this does not imply that they are identical. In FIG. 7a, semiconductor device 400 includes a semiconductor substrate 401. A disposable fill layer 410, for example of amorphous carbon or some other suitable material, has been formed over the front side surface 402 of substrate 401. Other suitable disposable materials include, for example, oxides and low-k materials, silicon Nitride (SiN), and polysilicon. A photoresist layer 405 has been formed over the disposable fill layer 410 and patterned. In FIG. 7a, the remaining portions of photoresist layer 405 are photoresist structures 426, 427, and 428. These photoresist structures form recesses 406, 407, 408, and 409.

Figure 7B:
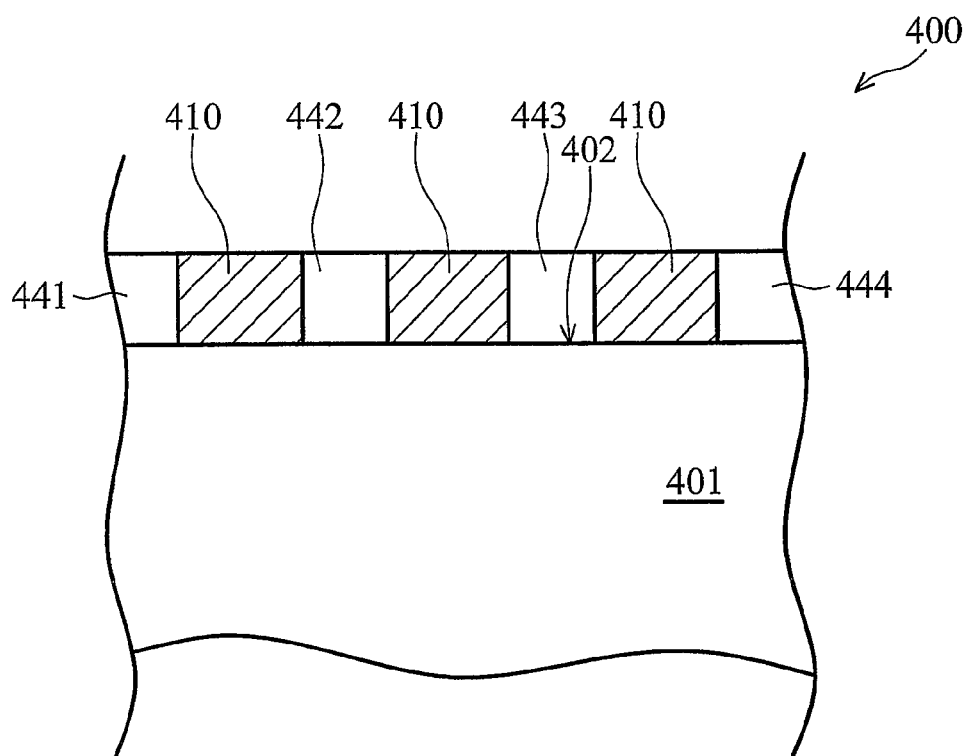

An anisotropic etching process may be performed to remove the regions of the disposable fill layer 410 that are not protected by one of the photoresist structures. The vacated portions are then filled, in this embodiment, with a conductive material such as copper. The conductors may, for example, be interconnects or portions of interconnects that together form a metal layer for interconnecting various operational components. In this case, the substrate 401 may be not a wafer, but rather a dielectric layer that has been deposited over a number of operational components. For the purpose of describing the invention, the definition of substrate will be broad enough to include upper layers in a semiconductor device such as the one just described. The copper may be added at a single layer and then planarized. In any event, the excess copper, if any, and the remaining photoresist are removed, resulting in the configuration shown in FIG. 7b. In FIG. 7b, copper conductors 441, 442, 443, and 444 are disposed between the remaining portions of disposable fill material layer 410.

Figure 7C:
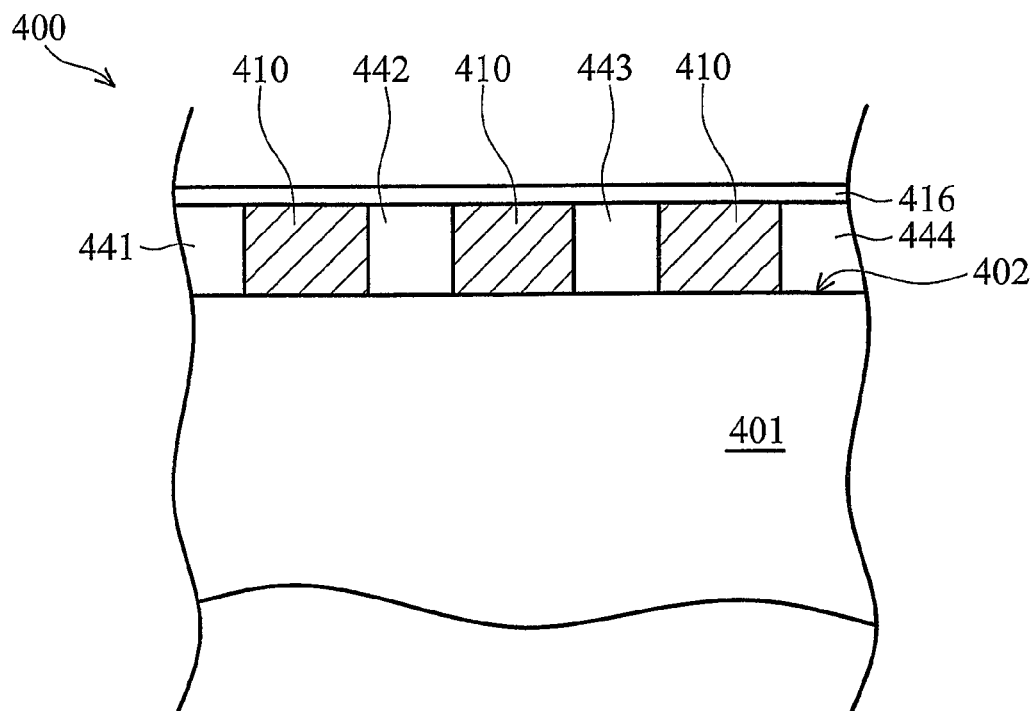
Figure 7D:
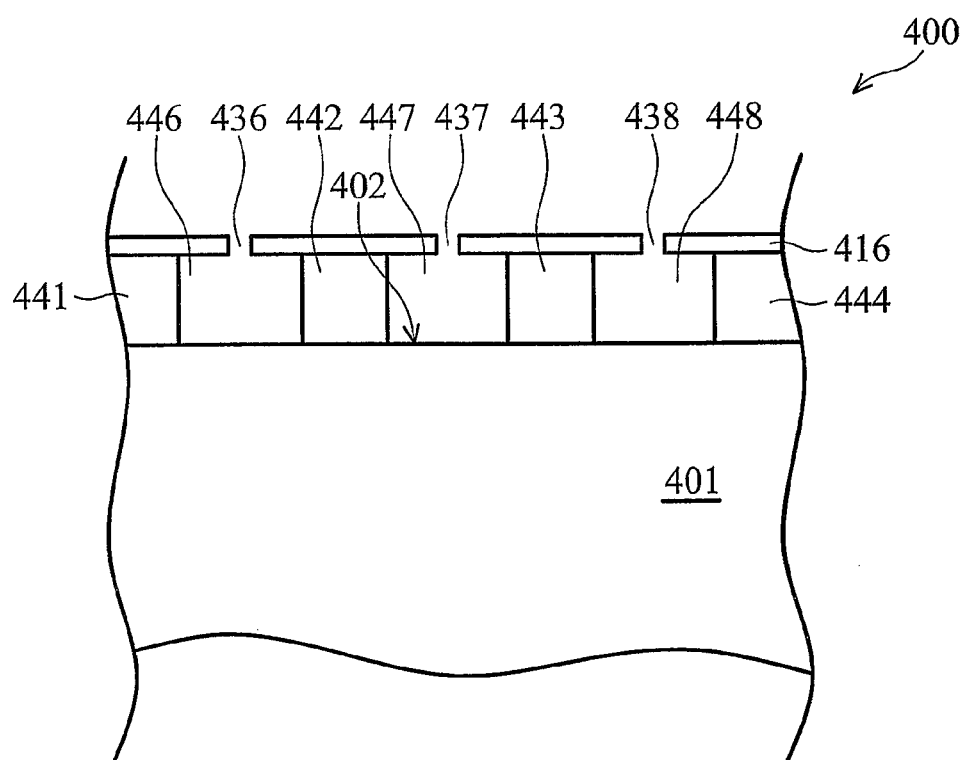
Figure 7E:
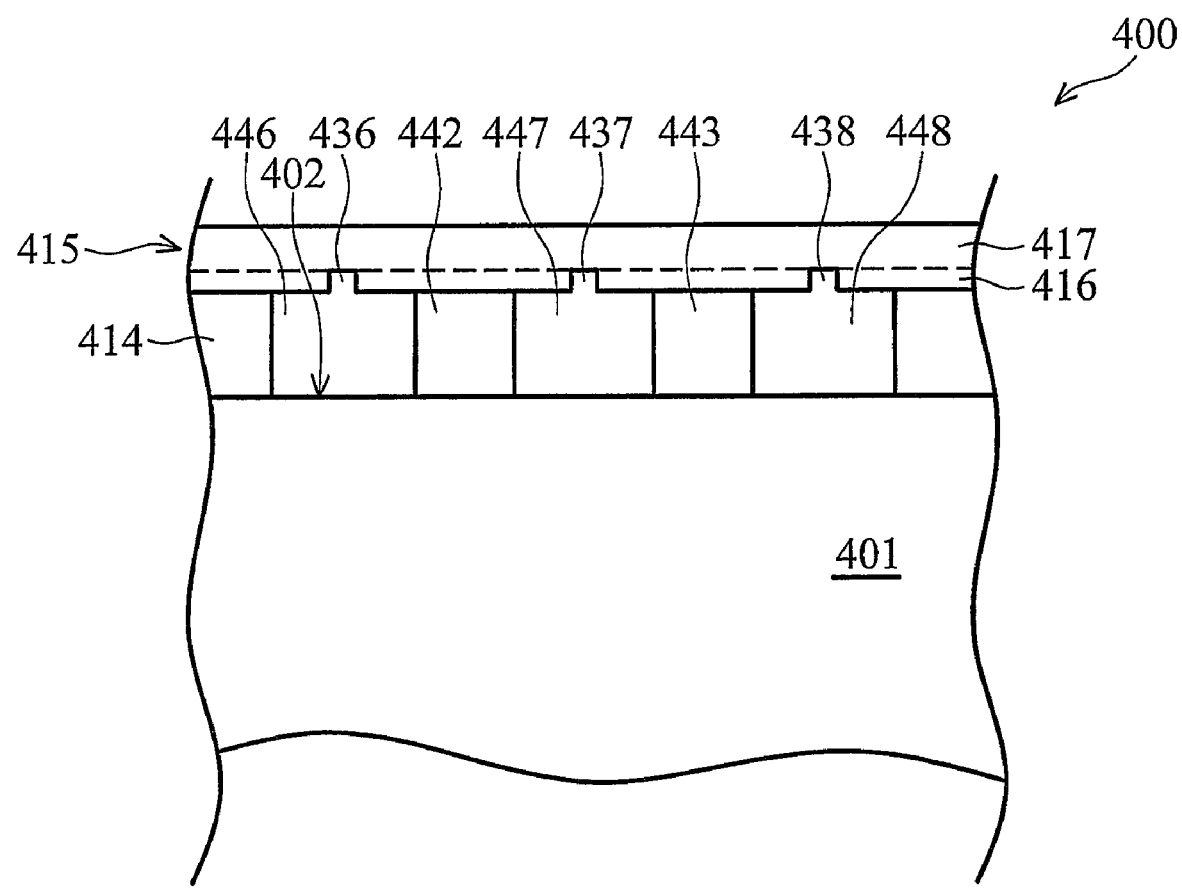

At this time a first dielectric layer 416 is formed over the disposable fill material layer 410 and the conductors 441 through 444, as shown in FIG. 7c. Small openings 436, 437, and 438 are then formed to expose respective remaining portions of disposable material layer 410. This permits these remaining portions to be removed by an isotropic etch, leaving air-filled recesses 446, 447, and 448. This configuration is shown in FIG. 7d. These air filled recesses, which may be filled with a particular gas if desired, are closed by the addition of a second dielectric layer 417. In this embodiment, dielectric first layer 416 and second layer 417 combine to form a single front side dielectric layer 415. The previous upper boundary of first layer 416 is shown by a broken line.

Although the present invention and its advantages have been described in detail, it should be understood that various changes, substitutions and alterations can be made herein without departing from the spirit and scope of the invention as defined by the appended claims. For example, the processes described above may be combined to form a semiconductor device having, for example, both conductor filled vias and air filled recesses.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, comprising:
   providing a semiconductor substrate having a front surface and a back surface;
   forming a via in the semiconductor substrate, wherein the via is co-planar with the front surface of the semiconductor substrate;
   filling the via with a disposable material, the disposable material being co-planar with the front surface of the semiconductor substrate, wherein the disposable material comprises at least one of amorphous carbon, low-k dielectric material, and polysilicon;
   thinning the substrate such that the via is co-planar with the back surface of the semiconductor substrate, while the via is filled with the disposable material;
   forming a first dielectric layer on the filled via;
   removing a portion of the first dielectric layer providing a small opening, wherein the small opening exposes a portion of the disposable material of the filled via;
   etching the disposable material through the small opening;
   after etching the disposable material, filling the via with a permanent fill material; and
   forming a second dielectric layer over the first dielectric layer so as to close the small opening.

2. The method of claim 1, wherein the permanent fill material is a metal.

3. The method of claim 2, wherein the metal is copper.

4. The method of claim 2, further comprising forming a barrier layer prior to filling the via with a permanent fill material.

5. The method of claim 1, wherein the permanent fill material is a dielectric.

6. The method of claim 5, wherein the dielectric material has a k-value of less than about 4.

7. The method of claim 1, further comprising performing a passivation on the sidewalls of the via.

8. The method of claim 7 wherein the passivation is performed prior to filling the via with disposable material.

9. The method of claim 1, wherein forming the via comprises:
   forming a photoresist layer;
   patterning the photoresist layer;
   performing an etch; and
   removing the remaining photoresist.

10. The method of claim 1, further comprising:
   filling the via with a permanent fill material comprising metal; and
   forming a metal structure in the second-dielectric-layer, the metal structure being in communication with the permanent fill material.

11. The method of claim 1, wherein the disposable material comprises amorphous carbon.

12. A method for filling a via formed in a semiconductor substrate, comprising:
   depositing a disposable material in the via to be co-planar with the semiconductor substrate, wherein the disposable material is amorphous carbon;
   forming a dielectric layer over a first end of the via and the adjacent substrate surface,
   thinning the substrate to expose a second via end while the disposable material is in the via;
   etching the disposable material through the open second via end, and thereafter, depositing a via fill material in the via through the open second via end; and
   forming a second dielectric layer over the second end of the via and the adjacent substrate.

13. The method of claim 12, further comprising performing a passivation of the via side walls prior to depositing the disposable material.

14. The method of claim 12, wherein the via fill material comprises a metal.

15. The method of claim 14 further comprising, before filling via with metal, depositing a barrier layer.

16. The method of claim 12, wherein the via fill material comprises a dielectric.

* * * * *